United States Patent
Wang et al.

(10) Patent No.: US 10,303,279 B2
(45) Date of Patent: May 28, 2019

(54) DETECTION ASSEMBLY, TOUCH DISPLAY DEVICE, TOUCH POSITIONING METHOD AND PRESSURE DETECTION METHOD

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Haisheng Wang, Beijing (CN); Xue Dong, Beijing (CN); Hailin Xue, Beijing (CN); Xiaochuan Chen, Beijing (CN); Yingming Liu, Beijing (CN); Xiaoliang Ding, Beijing (CN); Shengji Yang, Beijing (CN); Weijie Zhao, Beijing (CN); Changfeng Li, Beijing (CN); Wei Liu, Beijing (CN); Pengpeng Wang, Beijing (CN); Pengcheng Lu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/540,440

(22) PCT Filed: May 12, 2016

(86) PCT No.: PCT/CN2016/081866
§ 371 (c)(1),
(2) Date: Jun. 28, 2017

(87) PCT Pub. No.: WO2017/156854
PCT Pub. Date: Sep. 21, 2017

(65) Prior Publication Data
US 2018/0046302 A1    Feb. 15, 2018

(51) Int. Cl.
*G06F 3/041* (2006.01)
*G06F 3/043* (2006.01)
(Continued)

(52) U.S. Cl.
CPC ............ *G06F 3/0414* (2013.01); *G06F 3/044* (2013.01); *G06F 3/0412* (2013.01);
(Continued)

(58) Field of Classification Search
CPC ....... G06F 3/044; G06F 3/0412; G06F 3/0414
See application file for complete search history.

(56) References Cited

U.S. PATENT DOCUMENTS

| 6,250,159 B1 * | 6/2001 | Kreier | G01N 29/07 |
| | | | 73/602 |
| 2004/0090432 A1 * | 5/2004 | Takahashi | G06F 3/0436 |
| | | | 345/173 |

(Continued)

FOREIGN PATENT DOCUMENTS

| CN | 201773380 A | 3/2011 |
| CN | 104424420 A | 3/2015 |

(Continued)

OTHER PUBLICATIONS

The International Search Report dated Dec. 22, 2016; PCT/CN2016/081866.

*Primary Examiner* — Kent W Chang
(74) *Attorney, Agent, or Firm* — Ladas & Parry LLP (57) ABSTRACT

A detection assembly, a touch display device, a touch positioning method and a pressure detection method are provided. The detection assembly includes: a first substrate; an acoustic wave generation device provided on the first substrate; an acoustic wave detection device which is provided on the first substrate and at a side, away from the first substrate, of the acoustic wave generation device and (Continued)

includes a plurality of acoustic wave sensing units spaced apart from each other; and a contact layer covering the acoustic wave detection device.

20 Claims, 4 Drawing Sheets

(51) Int. Cl.
*G06F 3/044* (2006.01)
*H01L 41/08* (2006.01)
*H01L 27/20* (2006.01)
*H01L 41/113* (2006.01)

(52) U.S. Cl.
CPC ............ *G06F 3/0436* (2013.01); *H01L 27/20* (2013.01); *H01L 41/08* (2013.01); *H01L 41/1132* (2013.01)

(56) References Cited

U.S. PATENT DOCUMENTS

| | | | | |
|---|---|---|---|---|
| 2011/0115337 A1* | 5/2011 | Nakamura | ............ | G10K 9/122 310/334 |
| 2015/0016223 A1* | 1/2015 | Dickinson | ............... | G06F 3/043 367/87 |

FOREIGN PATENT DOCUMENTS

| | | | |
|---|---|---|---|
| CN | 104809431 A | 7/2015 | |
| CN | 104835439 A | 8/2015 | |
| CN | 105046243 A | 11/2015 | |

* cited by examiner

DETECTION ASSEMBLY, TOUCH DISPLAY DEVICE, TOUCH POSITIONING METHOD AND PRESSURE DETECTION METHOD

TECHNICAL FIELD

Embodiments of present disclosure relate to a detection assembly, a touch display device, a touch positioning method and a pressure detection method.

BACKGROUND

Presently, touch technologies have been widely used in cellphones, tablet PCs and other electronic devices. The touch technologies provide an efficient and convenient way of human-machine interaction with the basic principle of capturing touch and action information of a touch object (for example, a human finger) as a starting point, converting the obtained touch and action information into an electrical signal, and determining and recognizing the electrical signal, so as to realize a control function.

In addition, a new development trend is to employ a fingerprint recognition technology in an electronic device (for example, a fingerprint is used in the electronic device as an unlock code) to protect the security of stored data.

SUMMARY

At least one embodiment of present disclosure provides a detection assembly, a touch display device, a touch positioning method and a pressure detection method, so as to realize a design of integrating a plurality of detection functions.

At least one embodiment of the present disclosure provides a detection assembly including: a first substrate; an acoustic wave generation device provided on the first substrate; an acoustic wave detection device which is provided on the first substrate and at a side, away from the first substrate, of the acoustic wave generation device and includes a plurality of acoustic wave sensing units spaced apart from each other; and a contact layer covering the acoustic wave detection device.

At least one embodiment of the present disclosure further provides a touch display device which includes the above detection assembly.

At least one embodiment of the present disclosure further provides a touch positioning method for the above detection assembly, and the method includes: transmitting an acoustic wave signal by the acoustic wave generation device in a direction from the first substrate to the contact layer, the acoustic wave signal being transmitted at a first time; detecting the acoustic wave signal by the acoustic wave detection device before the acoustic wave signal reaches the contact layer, the acoustic wave signal being detected at a second time; and determining whether a difference between the second time and the first time is less than a preset value, the preset value being a duration from the time at which the acoustic wave signal is transmitted to the time at which the acoustic wave signal is detected before reaching the contact layer in a case that no touch event occurs. In the case that the difference between the second time and the first time is less than the preset value, it is determined that a touch event occurs, or a magnitude of a pressure applied to the contact layer is determined according to the acoustic wave signal which is detected.

At least one embodiment of the present disclosure provides a pressure detection method for the above detection assembly. In the method, the detection assembly further includes a spacing layer which is arranged between the acoustic wave generation device and the acoustic wave detection device in a direction perpendicular to the first substrate, and the pressure detection method includes: transmitting an acoustic wave signal by the acoustic wave generation device in a direction from the first substrate to the contact layer, the acoustic wave signal being transmitted at a first time; detecting the acoustic wave signal by using the acoustic wave detection device, the acoustic wave signal being detected at a second time; and determining a value of a pressure applied to the contact layer according to a difference between the second time and the first time.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The Fingerprint recognition device in a current electronic device is usually independent of other components within the electronic device, and this results in a lower level of integration of the electronic device.

At least one embodiment of the present disclosure provides a detection assembly, a touch display device, a touch positioning method and a pressure detection method, in which an acoustic wave sensing principle is used to provide a design of integrating a variety of detection functions, such a design can achieve at least two of the fingerprint recognition, the touch function and the pressure detection.

Figure 1:
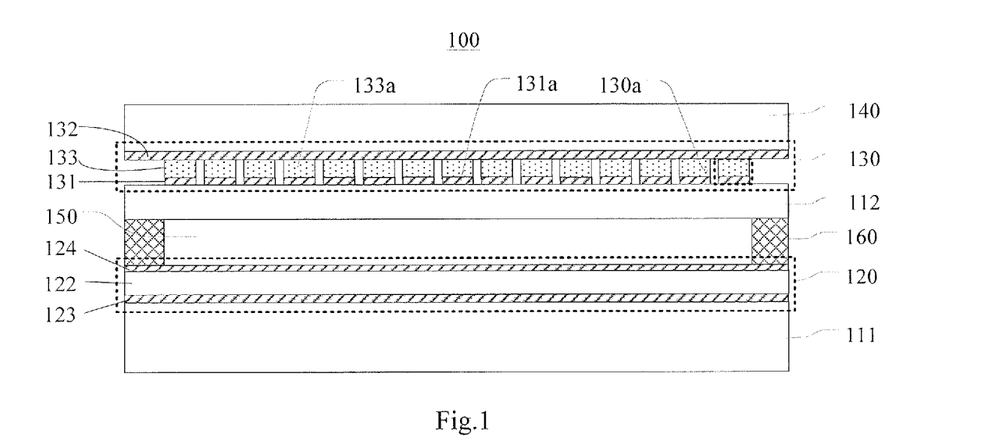
FIG. 1 is a partial cross-sectional schematic view of a detection assembly provided in an embodiment of the present disclosure.

As shown in FIG. 1, at least one embodiment of the present disclosure provides a detection assembly 100 including: a first substrate 111; an acoustic wave generation device 120 arranged on the first substrate 111; an acoustic wave detection device 130 being arranged on the first substrate 111 and located at a side, away from the first substrate 111, of the acoustic wave generation device 120, and including a plurality of acoustic wave sensing units 130a spaced apart from each other; and a contact layer 140 which covers the acoustic wave detection device 130.

For example, the first substrate 111 may be a glass substrate, a quartz substrate, a plastic substrate or the like.

The acoustic wave generation device 120 may transmit an acoustic wave (for example, an ultrasonic wave) signal, and correspondingly, and the acoustic wave detection device 130 may sense such an acoustic wave signal through the acoustic wave sensing units 130a, in order to achieve a detection of the acoustic wave signal. The ultrasonic wave signal is adopted due to the good orientation property and strong penetrating capacity of the ultrasonic wave, so as to enable the acoustic wave detection device 130 to detect a more concentrated acoustic wave signal, so that the recognition of the fingerprint and touch position is facilitated. Certainly, the acoustic wave signals of other frequencies may also be employed as required.

For example, the contact layer 140 may be any layer structure that may be in contact with a touch object (for example, a user's finger), such as a glass substrate, a quartz substrate, or a plastic film or the like.

In the detection assembly 100 provided in an embodiment of the present disclosure, the acoustic wave generation device 120 is configured to transmit an acoustic wave signal to the contact layer 140; and in a case that the contact layer 140 is touched, the intensity of the acoustic wave signal, reflected by the contact layer 140 and detected at a touch position by the acoustic wave detection device 130, changes as compared with that before the contact layer 140 is touched, and hereby, it is possible to determine the touch position. In addition, since the acoustic wave detection device 130 includes a plurality of acoustic wave sensing units 130a spaced apart from each other, by setting the dimension of the acoustic wave sensing units 130a, the detection assembly provided in embodiments of the present disclosure can be used for fingerprint recognition.

Referring to FIG. 1 again, for example, the detection assembly 100 may further include a spacing layer 150 arranged between the acoustic wave generation device 120 and the acoustic wave detection device 130 in a direction perpendicular to the first substrate 111. Since the spacing layer 150 is arranged between the acoustic wave generation device 120 and the acoustic wave detection device 130, when a touch event occurs, the distance between the acoustic wave generation device 120 and the acoustic wave detection device 130 changes at the touch position, this results in a variation in the time at which the acoustic wave signal is detected by the acoustic wave detection device 130, the difference between the time at which the acoustic wave detection device 130 detects the acoustic wave signal and the time at which the acoustic wave generation device 120 transmits the acoustic wave signal varies as the magnitude of touch pressure varies, and thus it is possible to determine the magnitude of the touch pressure and the touch position.

For example, the spacing layer 150 may be a gas layer (for example, an air layer) etc., so long as when the contact layer 140 is touched, the distance between the acoustic wave generation device 120 and the acoustic wave detection device 130 changes at the touch position.

For example, the detection assembly 100 may further include a second substrate 112 and a support portion 160, the second substrate 112 is arranged between the acoustic wave generation device 120 and the acoustic wave detection device 130 in the direction perpendicular to the first substrate 111, and the support portion 160 is arranged between the second substrate 112 and the acoustic wave generation device 120 in the direction perpendicular to the first substrate 111, so that there is a gap between the second substrate 112 and the acoustic wave generation device 120, i.e., the spacing layer 150 is formed.

For example, the second substrate 112 may be a glass substrate, a quartz substrate or a plastic substrate, etc.

For example, the support portion 160 may not overlap the plurality of the acoustic wave sensing units 130a included in the acoustic wave detection device 130 in the direction perpendicular to the first substrate 111, that is, the support portion 160 may be located outside the touch detection area of the detection assembly, so as to avoid affecting the acoustic wave detection device 130 from detecting the acoustic wave signal.

For example, referring to FIG. 1, the acoustic wave detection device 130 may include: a first electrode layer 131 being provided on the second substrate 112 and including a plurality of sub-electrodes 131a spaced apart from each other, and a first piezoelectric material layer 133 including a plurality of piezoelectric layer patterns 133a which are spaced apart from each other, correspond to the above plurality of the sub-electrodes 131a in a one-to-one manner and are electrically connected to the sub-electrodes 131a respectively to form the above plurality of acoustic wave sensing units 130a.

That is, a piezoelectric transducer may be employed in the acoustic wave detection device 130. In this situation, the acoustic wave sensing units 130a may be used to sense the acoustic wave signal and to generate corresponding electrical signals, that is, when the acoustic wave signal transmitted from the acoustic wave generation device 120 passes through the first piezoelectric material layer 133, corresponding electrical signals are respectively generated at the surfaces of the plurality of piezoelectric layer patterns 133a of the first piezoelectric material layer 133; and the plurality of sub-electrodes 131a included in the first electrode layer 131, when being connected with conductive wires, can respectively conduct the electrical signals generated by the corresponding piezoelectric layer patterns 133a.

For example, the acoustic wave detection device 130 may further include a second electrode layer 132 provided on the second substrate 112 and provided on a side, away from the first electrode layer 131, of the first piezoelectric material layer 133. The second electrode layer 132 may be used to apply a bias voltage to the first piezoelectric material layer 133 so as to facilitate the generation of corresponding electrical signals on the surfaces of the plurality of piezoelectric layer patterns 133a of the first piezoelectric material layer 133, when the acoustic wave signal passes through the first piezoelectric material layer 133. Of course, when the acoustic wave detection device 130 detects the acoustic wave signal, it is also possible not to apply a voltage to the second electrode layer 132, that is, the bias voltage may not be supplied to the first piezoelectric material layer 133.

For example, each piezoelectric layer pattern 133a and each sub-electrode 131a may have an area less than or equal to 90 μm (micron)×90 μm, for example less than or equal to 80 μm×80 μm or 50 μm×50 μm, preferably less than or equal to 50 μm×50 μm. For example, the planar shape of each sub-electrode may be a square with a side length less than or equal to 50 μm. Since the width of one convexity-concavity period of a finger is usually 300 μm, by setting the size of the sub-electrodes, it is advantageous to ensure the clarity of the recognized fingerprint.

For example, both the material for the first electrode layer 131 and the material for the second electrode layer 132 may be a transparent conductive material, such as indium tin oxide, indium gallium zinc oxide and other transparent conductive metal oxides, and the material for the first piezoelectric material layer 133 is transparent, such as a transparent ferroelectric and piezoelectric ceramics or a transparent polyvinylidene fluoride piezoelectric material or the like. The use of transparent materials for making the first and second electrode layers and the first piezoelectric material layer may avoid the influence against the display effect when the detection assembly provided in embodiments of the present disclosure is applied to a display device. Of course, the embodiments of the present disclosure include, but are not limited to, these transparent conductive materials and transparent piezoelectric materials.

For example, a piezoelectric transducer may also be employed in the acoustic wave generation device 120. In such a case, for example, as shown in FIG. 1, the acoustic wave generation device 120 may include a third electrode layer 123, a second piezoelectric material layer 122, and a fourth electrode layer 124 arranged sequentially on the first substrate 111, and the third electrode layer 123 and the fourth electrode layer 124 are configured to apply an electrical signal to the second piezoelectric material layer 122. According to the converse piezoelectric effect, for example, the second piezoelectric material layer 122 is capable of generating an acoustic wave signal when a high-frequency electrical signal is applied to the third electrode layer 123 and the fourth electrode layer 124. By regulating the frequency of the applied high-frequency electrical signal, the second piezoelectric material layer 122 may be caused to generate an ultrasonic wave signal which may be transmitted to the contact layer 140.

For example, the material for the third electrode layer 123 and the material for the fourth electrode layer 124 may be a transparent conductive material, and the material for the second piezoelectric material layer 122 is transparent, so as to avoid influence against the display effect when the detection assembly provided in embodiments of the present disclosure is applied to a display device.

Figure 2:
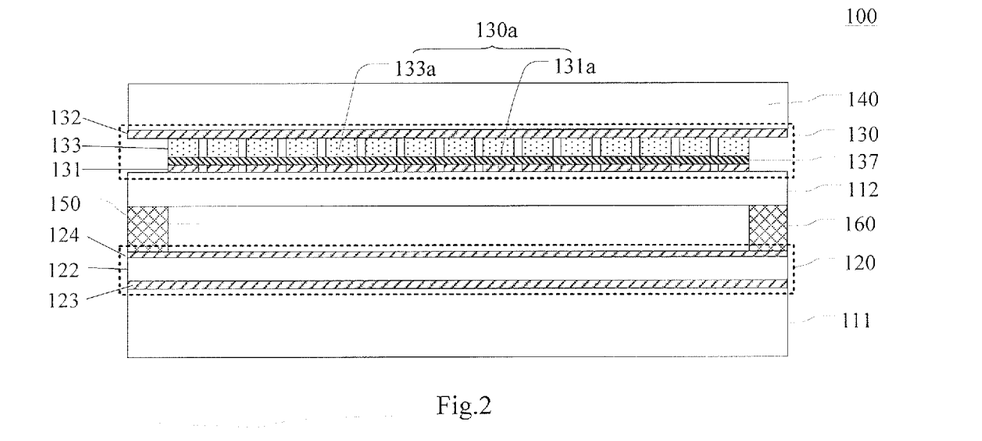
FIG. 2 is a partial cross-sectional schematic view of a detection assembly provided in another embodiment of the present disclosure.

In the embodiment shown in FIG. 1, the first electrode layer 131 and the first piezoelectric material layer 133 which are included by the acoustic wave detection device 130 are in a direct contact with each other; of course, the embodiments of present disclosure are not limited to the embodiment shown in FIG. 1. For example, as shown in FIG. 2, the first electrode layer 131 and the first piezoelectric material layer 133 may be connected with each other by a conductive connection portion 137. For example, the conductive connection portion 137 may be formed of an anisotropic conductive adhesive, and such an anisotropic conductive adhesive enables the electrical connection between the piezoelectric layer pattern 133a and the corresponding sub-electrode 131a, but not the electrical conduction between adjacent sub-electrodes 131a.

Figure 3:
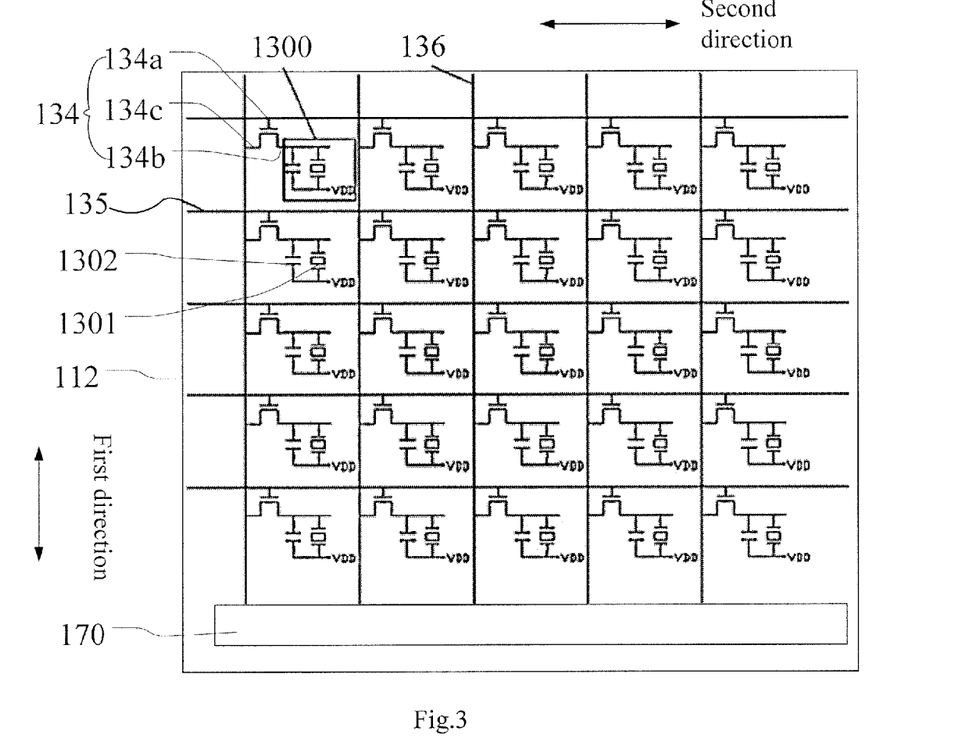
FIG. 3 is a partial circuit schematic drawing of a detection assembly provided in an embodiment of the present disclosure.

As shown in FIG. 3, in the case where a piezoelectric transducer is employed in the acoustic wave detection device (not shown in FIG. 3), the acoustic wave detection device may include a plurality of acoustic wave detection units 1300, such acoustic wave detection units 1300 correspond to the above plurality of acoustic wave sensing units 130a respectively, that is, the second electrode layer 132 included by the acoustic wave detection device 130 as well as the above plurality of acoustic wave sensing units 130a form the above plurality of acoustic wave detection units 1300, each of the acoustic wave detection units 1300 includes one acoustic wave sensing unit 130a. Each acoustic wave detection unit 1300 includes: a piezoelectric element 1301 configured to generate an electrical signal when the acoustic wave signal emitted from the acoustic wave generation device 120 passes through the piezoelectric element 1301; and a capacitor element 1302 provided in parallel with the piezoelectric element 1301 and configured to store the electrical signal generated by the piezoelectric element 1301.

For example, the acoustic wave detection device may further include a plurality of transistors 134 electrically connected with the above plurality of acoustic wave detection units 1300 respectively, each transistor 134 includes a gate electrode 134a, a source electrode 134b and a drain electrode 134c, and the source electrode 134b is electrically connected to the acoustic wave detection unit 1300 which is electrically connected to this transistor 134. The transistor 134 functions as a signal reading switch for the corresponding acoustic wave detection unit 1300. For example, the transistor 134 may be a thin film transistor or the like.

For example, the acoustic wave detection device may further include a plurality of gate lines 135 and a plurality of data lines 136, the gate lines 135 are provided on the second substrate 112 and are sequentially arranged in a first direction, the data lines 136 are provided on the second substrate 112 and are sequentially arranged in a second direction, the second direction intersects with the first direction, the plurality of data lines 136 overlaps the plurality of gate lines 135 in a direction perpendicular to the second substrate 112, and are spaced apart from the plurality of gate lines 135 at overlapping positions; the gate electrodes 134a of the above plurality of transistors 134 are electrically connected to the gate lines 135 respectively, and the drain electrodes 134c of the above plurality of transistors 134 are electrically connected to the data lines 136 respectively. By applying a scanning signal (for example, a progressive (line by line) scanning mode may be employed) to the gate lines 135, it is possible to control the conduction states of the transistors 134 respectively electrically connected to the gate lines 135, and in the case where a transistor 134 is turned on, the signal detected by a corresponding acoustic wave detection unit 1300 may be conducted to a corresponding data line 136 through this transistor 134.

For example, the detection assembly (not shown in FIG. 3) provided in at least one embodiment of the present disclosure may further include a touch chip 170 which is electrically connected to the plurality of data lines 136. In this way, the signals of the data lines 136 may be conducted to the touch chip 170 for the touch position determination, fingerprint recognition or pressure detection.

The principle of fingerprint recognition and acoustic wave touch control of the detection assembly provided in embodiments of the present disclosure will be described below in conjunction with FIG. 4.

In the embodiment of present disclosure, in the case where no touch occurs at the surface of the contact layer 140, the acoustic wave signal emitted from the acoustic wave generation device 120 can be reflected by the surface of the contact layer 140, and the acoustic wave detection device 130 may detect the reflected acoustic wave signal. As shown in FIG. 4, in the case where a touch occurs on the surface of the contact layer 140, the contact between a touch object (for example, a user's finger, only partial fingerprint of the user's finger is shown in FIG. 4, see the saw-shaped line) and the surface of the contact layer 140 may allow a portion of the acoustic wave signal to pass through the contact layer 140 and then to enter into the touch object, in this way, the acoustic wave signal reflected by the contact layer 140 at the touch position and detected by the acoustic wave detection device 130 is changed, and the acoustic wave signal reflected by the position which is not touched remain unchanged, and thus, by detecting the deviation between the acoustic wave signals reflected respectively at the touch position and at the position which is not touched, the touch position can be determined, that is, an acoustic wave touch control is achieved.

In addition, by setting the sizes of the acoustic wave sensing units (not shown in FIG. 4) included in the acoustic wave detection device 130, one convexity-concavity period of a finger can correspond to a plurality of acoustic wave sensing units; and due to the signals reflected respectively at a fingerprint concavity and a fingerprint convexity of the finger having different intensities, the acoustic wave sensing units corresponding to fingerprint concavities and that corresponding to the fingerprint convexities sense different reflected acoustic wave signals, resulting in different electrical signals. For example, the acoustic wave sensing units corresponding to the fingerprint concavities and that correspond to the fingerprint convexities generate different amounts of charge, and the touch chip can achieve fingerprint recognition by detecting the difference in the amount of charge.

Since the acoustic wave signal emitted from the acoustic wave generation device 120 passes through the acoustic wave detection device 130 before reaching the contact layer 140, and again reaches the acoustic wave detection device after being reflected by the contact layer 140, therefore, in order to facilitate the detection of the reflected acoustic wave signal by the acoustic wave detection device 130, a certain time difference may be set to avoid the mixing of an acoustic wave signal travels toward the contact layer 140 with an acoustic wave signal reflected by the contact layer 140. For example, it is possible to start timing when the acoustic wave generation device 120 transmits an acoustic wave signal, and when or after the acoustic wave signal is transmitted to the finger, the acoustic wave detection device 130 starts to operate.

Figure 4:
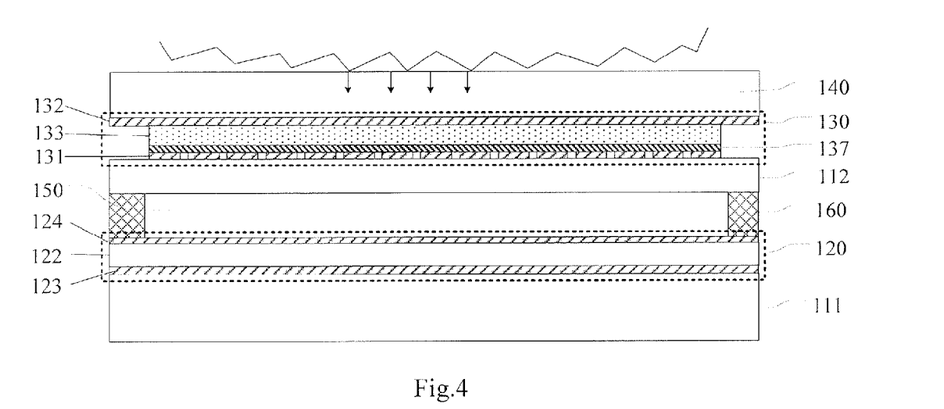
FIG. 4 is a schematic diagram of achieving fingerprint recognition by a detection assembly provided by an embodiment of the present disclosure.

It should be noted that FIG. 4 illustrates a first piezoelectric material layer 133 merely by way of example, and in practice, the first piezoelectric material layer 133 includes a plurality of piezoelectric layer patterns as mentioned above.

Figure 5:
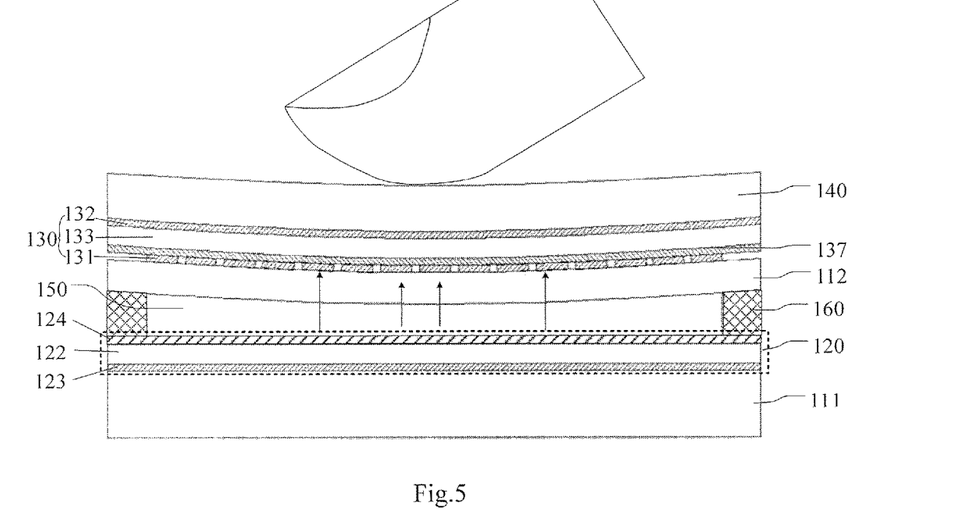
FIG. 5 is a schematic diagram of achieving pressure sensing by the detection assembly provided by an embodiment of the present disclosure.

The principle of the pressure sensing achieved by the detection assembly provided by the embodiment of the present disclosure will be described below with reference to FIG. 5. As shown in FIG. 5, when a finger applies a pressure, the second substrate 112 generates deformation correspondingly. For example, detection may be performed before the acoustic wave signal emitted from the acoustic wave generation device 120 reaches the contact layer 140, in such a case, since the second substrate 112 is deformed, there is a difference of the time at which the acoustic wave signal reaches the acoustic wave detection device 130 between the case that the pressure is applied and the case that no pressure is applied, and when the magnitude of the pressure changes, such a difference also changes accordingly, hence, the acoustic wave detection device 130 can recognize the magnitude of the pressure and/or the pressure touch control can be achieved by detecting such a difference. Of course, it is also possible to, after the acoustic wave signal emitted from the acoustic wave generation device 120 reaches the contact layer 140, detect the difference of the time at which the acoustic wave detection device 130 detects the reflected acoustic wave signal between the case that the pressure is applied and the case that no pressure is applied.

It should be noted that FIG. 5 illustrates the first piezoelectric material layer 133 merely by way of example, and in practice, the first piezoelectric material layer 133 includes a plurality of piezoelectric layer patterns as mentioned above.

As can be seen from the above, by regulating the operating time of the acoustic wave detection device 130, it is possible to detect the touch, the fingerprint and the pressure signal in a time-sharing way. For example, before the acoustic wave signal emitted from the acoustic wave generation device 120 reaches the contact layer 140, the detection of the magnitude of the pressure and/or the pressure touch control can be carried out; and/or after the acoustic wave signal emitted from the acoustic wave generation device 120 reaches the contact layer 140, the fingerprint recognition and/or the acoustic wave touch control can be carried out.

The detection assembly provided by the embodiments of present disclosure may be a touch panel, a fingerprint recognizer or a pressure sensor etc. . . .

Figure 6:
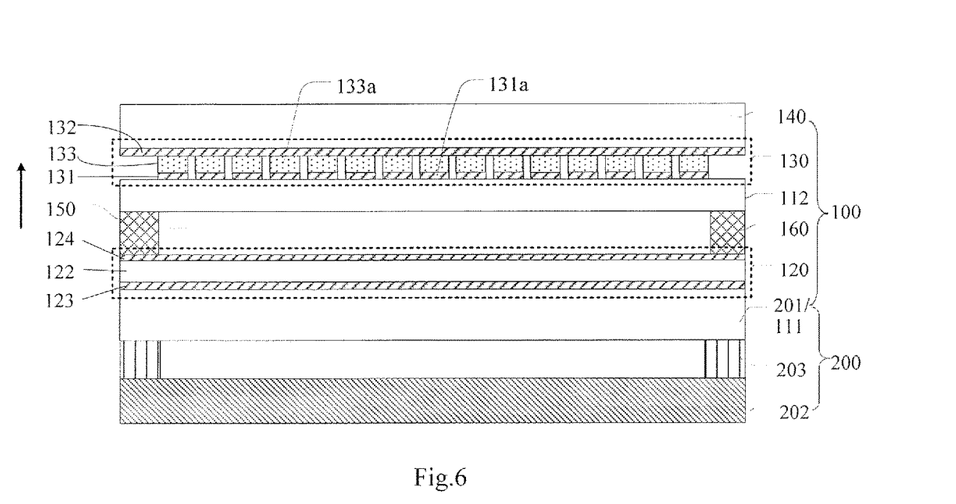
FIG. 6 is a partial cross-sectional schematic view of a touch display device provided in an embodiment of the present disclosure.

At least one embodiment of the present disclosure also provides a touch display device, as shown in FIG. 6, the touch display device includes a detection assembly 100 provided by any one of the above embodiments.

For example, the touch display device may further include a display panel 200 which is configured to emit imaging light in a preset direction (as indicated by an arrow in FIG. 6, which may be any direction set according to actual needs), and the acoustic wave generation device 120 and the acoustic wave detection device 130 of the detection assembly 100 are provided outside the display panel 200, and overlap the display panel 200 in the preset direction.

For example, the display panel 200 may include substrates 201, 202 opposite to each other and a connecting portion 203 for connecting the two substrates, and the detection assembly 100 may be disposed on a side, away from the substrate 202, of the substrate 201. For example, the substrate 201 may serve as the first substrate 111 included in the detection assembly 100.

Figure 7:
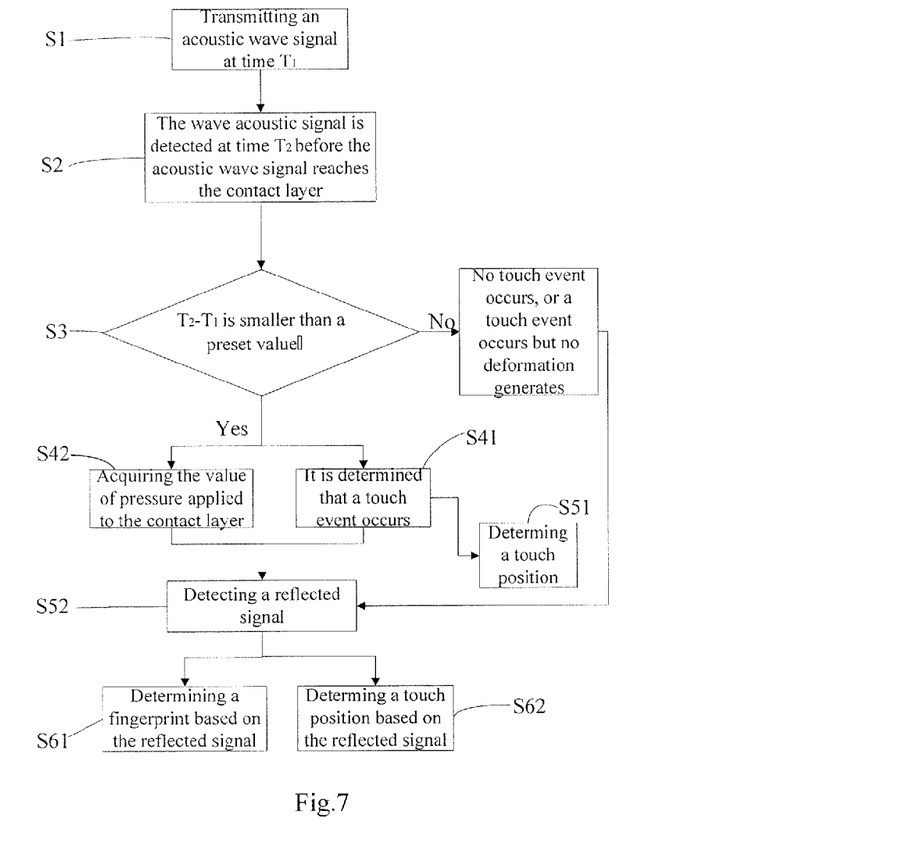
FIG. 7 is a flow chart of a touch positioning method provided in an embodiment of the present disclosure.

At least one embodiment of the present disclosure also provides a touch positioning method that may be used for the detection assembly 100 in any one of the embodiments described above. The structure of the detection assembly 100 can be seen in the description of the above embodiments, and will not be repeated here. As shown in FIGS. 1 and 7, the touch positioning method provided by the embodiment of present disclosure includes: using the acoustic wave generation device 120 to emit an acoustic wave signal in a direction from the first substrate 111 to the contact layer 140, so that the acoustic wave signal is transmitted at a first time T1, referring to step S1; before the acoustic wave signal reaches the contact layer 140, using the acoustic wave detection device 130 to detect the acoustic wave signal, in which step, the acoustic wave signal is detected at a second time T2, referring to step S2; and determining whether the difference between the second time T2 and the first time T1 is less than a preset value, referring to step S3, the preset value here being the duration from the time at which the acoustic wave signal is transmitted, to the time at which the acoustic wave signal is detected before the acoustic wave signal reaches the contact layer 140. If such a difference is less than the preset value, it is determined that a touch event occurs (referring to step S41), or alternatively, the magnitude of the pressure applied to the contact layer 140 is determined based on the detected acoustic wave signal (referring to step S42).

For example, the correspondence between the deformation amount of the second substrate 112 included in the detection assembly 100 and the magnitude of the pressure applied to the contact layer 140 may be calculated in advance; and in step S42, the deformation amount of the second substrate is calculated according to the time difference between the second time T2 and the first time T1 and the travelling speed of the acoustic wave signal, and the magnitude of the pressure is determined based on the above correspondence. Of course, embodiments of the present disclosure include, but are not limited thereto.

The determination of whether or not a touch event occurs can be referred to the relevant description of the embodiments of the above detection assembly, and will not be repeated here.

The acoustic wave generation device 120 may transmit acoustic wave signals intermittently, and the interval time between adjacent two acoustic wave signals transmitted by the acoustic wave generation device 120 is greater than or equal to a preset time interval, and such a preset time interval is the duration that, in a case that no touch event occurs, the acoustic wave signal travels to the contact layer 140 from the acoustic wave generation device 120 and the acoustic wave signal reflected by the contact layer 140 travels to the acoustic wave detection device 130. In this way, it is possible to avoid the influence caused by the mixing of the acoustic wave signal travelling to the contact layer 140 with the acoustic wave signal reflected by the contact layer 140.

For example, the touch positioning method provided by at least one embodiment of the present disclosure may further include: in a case that a touch event occurs or in a case that the magnitude of the pressure applied to the contact layer is determined, determining the touch position based on the detected acoustic wave signal, that is, it is proceeded to step S51.

For example, the method provided by at least one embodiment of the present disclosure may further include: in a case that a touch event occurs or in a case that the magnitude of the pressure applied to the contact layer is determined, using the acoustic wave detection device 130 to detect the reflected signal of the acoustic wave signal after being reflected by the contact layer 140, referring to step S52 in FIG. 7; and determining a fingerprint based on the reflected signal (referring to step S61), or determining the touch position based on the reflected signal (referring to step S62).

Steps S51, S60 and S62 may refer to the relevant descriptions in the embodiments of the detection assembly, and will not be repeated again.

Furthermore, when the difference between the second time T2 and the first time T1 is not smaller than the above preset value, it is possible that no touch event occurs, or alternatively, there may be a touch event but the distance between the acoustic wave detection device and the acoustic wave generation device remain unchanged. In such a case, the acoustic wave detection device may be used to detect the reflected signal after the acoustic wave is reflected by the contact layer, so as to further determine whether a touch event occurs or not and to determine the touch position. Of course, fingerprint recognition can be carried out based on the reflected signal.

Figure 8:
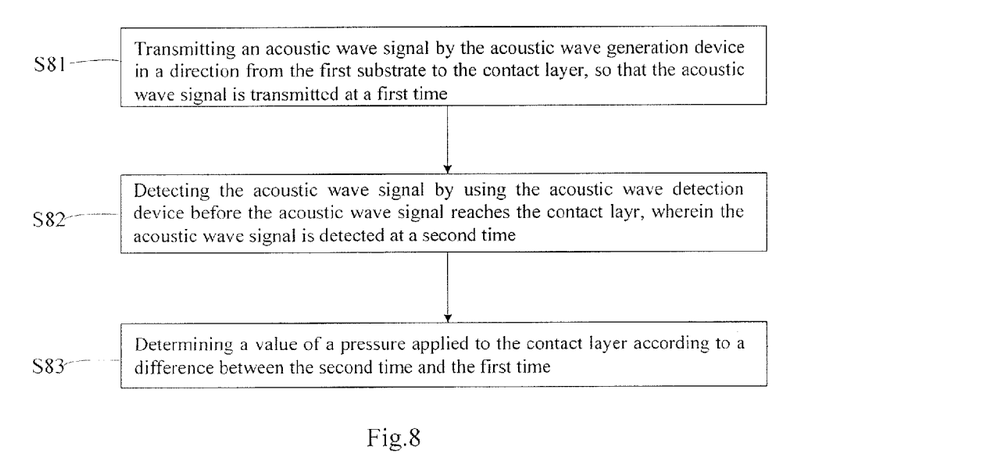
FIG. 8 is a flow chart of a pressure detection method provided in an embodiment of the present disclosure.

At least one embodiment of the present disclosure also provides a pressure detection method used with the detection assembly 100 including the spacing layer 150 provided by any one of the above embodiments, as shown in FIGS. 1 and 8, the method includes the following steps: step S81 in which the acoustic wave generation device 120 is used to emit an acoustic wave signal in a direction from the first substrate 111 to the contact layer 140, so that the acoustic wave signal is transmitted at a first time; step S82 in which the acoustic wave detection device 130 detects the acoustic wave signal, and in which the acoustic wave signal is detected at a second time; and step S83 in which the pressure value applied to the contact layer 140 is determined based on the difference between the second time and the first time.

For example, in step S82, it is possible to detect the acoustic wave signal by the acoustic wave detection device 130 before the acoustic wave signal emitted from the acoustic wave generation device 120 reaches the contact layer 140, or it is also possible to detect the acoustic wave signal reflected by the contact layer 140 by means of the acoustic wave detection device 130 after the acoustic wave signal emitted from the acoustic wave generation device 120 reaches the contact layer.

For example, in step S83, the deformation amount, which is caused by the contact layer 140 being applied with a pressure, of the second substrate of the detection assembly 100 may be calculated based on the difference between the second time and the first time as well as the travelling speed of the acoustic wave signal, then the value of the pressure applied to the contact layer 140 is determined based on such a deformation amount. Of course, the manner in which the pressure values are determined includes, but not limited to such a manner.

Of course, in addition to the above touch positioning method and pressure detection method, the detection assembly provided by any one of the above embodiments may also be used directly for fingerprint recognition. Taking the detection assembly shown in FIG. 1 as an example, the corresponding fingerprint recognition method may include the following steps: using the acoustic wave generation device 120 to emit an acoustic wave signal in a direction from the first substrate 111 to the contact layer 140; after the acoustic wave signal reaches the contact layer 140, using the acoustic wave detection device 130 to detect the acoustic wave signal reflected by the contact layer 140; and recognizing the fingerprint based on the reflected acoustic wave signal.

There are the following points to be noted: (1) in the drawings of the embodiments of the present disclosure, only the structures related to the embodiments of the present disclosure are referred to, and other structures may be referred to conventional designs; (2) the film thickness and shape of each layer in the drawings do not reflect the true proportions, and the purpose of which is merely illustrative of the contents of the embodiments of the present disclosure; and (3) in the case of no conflict, the features of the embodiments and the embodiments of the present disclosure may be combined with each other.

What are described above is related to the illustrative embodiments of the disclosure only and not limitative to the scope of the disclosure; the scopes of the disclosure are defined by the accompanying claims.

This application claims the benefit of Chinese Patent Application No. 201610159269.3, filed on Mar. 18, 2016, which is hereby entirely incorporated by reference as a part of the present application.

What is claimed is:

1. A touch positioning method for the detection assembly wherein the detection assembly comprises:
    a first substrate; an acoustic wave generation device provided on the first substrate; an acoustic wave detection device provided on the first substrate and at a side, away from the first substrate, of the acoustic wave generation device, wherein the acoustic wave detection device comprises a plurality of acoustic wave sensing units spaced apart from each other; and a contact layer covering the acoustic wave detection device; and
    the method comprises:
    transmitting an acoustic wave signal by the acoustic wave generation device in a direction from the first substrate to the contact layer, wherein the acoustic wave signal is transmitted at a first time;
    detecting the acoustic wave signal by the acoustic wave detection device before the acoustic wave signal reaches the contact layer, wherein the acoustic wave signal is detected at a second time before the acoustic wave signal reaches the contact layer; and
    determining whether a difference between the second time and the first time is less than a preset value, wherein the preset value is a duration from the time at which the acoustic wave signal is transmitted to the time at which the acoustic wave signal is detected before reaching the contact layer in a case that no touch event occurs; and in the case that the difference between the second time and the first time is less than the preset value, it is determined that a touch event occurs or a magnitude of a pressure applied to the contact layer is determined according to the acoustic wave signal which is detected.

2. The method according to claim 1, wherein the acoustic wave generation device transmits acoustic wave signals intermittently, and an interval time between adjacent two of the acoustic wave signals transmitted by the acoustic wave generation device is greater than or equal to a preset time interval, and the preset time interval is, in a case that no touch event occurs, a duration that the acoustic wave signal travels from the acoustic wave generation device to the contact layer and the acoustic wave signal reflected by the contact layer travels to the acoustic wave detection device.

3. The method according to claim 1, further comprising:
    in a case that the touch event occurs or the magnitude of the pressure applied to the contact layer is determined, detecting a reflected signal obtained after the acoustic wave signal is reflected by the contact layer by using the acoustic wave detection device; and
    determining a fingerprint according to the reflected signal, or determining a touch position according to the reflected signal.

4. The method according to claim 1, the detection assembly further comprising:
    a spacing layer located between the acoustic wave generation device and the acoustic wave detection device in a direction perpendicular to the first substrate, wherein the spacing layer is a gas layer.

5. The method according to claim 4, the detection assembly further comprising:
    a second substrate located between the acoustic wave generation device and the acoustic wave detection device in the direction perpendicular to the first substrate; and
    a support portion located between the second substrate and the acoustic wave generation device in the direction perpendicular to the first substrate so as to form the spacing layer.

6. The method according to claim 5, wherein
    the support portion does not overlap the plurality of the acoustic wave sensing units in the direction perpendicular to the first substrate.

7. The method according to claim 5, wherein the acoustic wave detection device comprises a plurality of acoustic wave detection units, the plurality of the acoustic wave detection units comprise the plurality of the acoustic wave sensing units respectively, and each of the acoustic wave detection units comprises:
    a piezoelectric element configured to generate an electrical signal in a case that an acoustic wave signal from the acoustic wave generation device passes through the piezoelectric element; and
    a capacitor element arranged in parallel with the piezoelectric element and configured to store the electrical signal.

8. The method according to claim 7, wherein the acoustic wave detection device further comprises:
    a plurality of transistors which are in electrical connection with the plurality of the acoustic wave detection units respectively, wherein each of the transistors comprises a gate electrode, a source electrode and a drain electrode, and the source electrode is connected to one of the acoustic wave detection units which is electrically connected with the transistor.

9. The method according to claim 8, wherein the acoustic wave detection device further comprises:
    a plurality of gate lines provided on the second substrate, sequentially arranged in a first direction, and electrically connected to gate electrodes of the plurality of the transistors respectively; and
    a plurality of data lines provided on the second substrate and sequentially arranged in a second direction, wherein the second direction intersects with the first direction, the plurality of the data lines overlaps the plurality of the gate lines in a direction perpendicular to the second substrate while being separated from the plurality of the gate lines at overlapping locations, and the plurality of the data lines are electrically connected to drain electrodes of the plurality of the transistors respectively.

10. The method according to claim 1, wherein the acoustic wave detection device comprises:
    a first electrode layer comprising a plurality of sub-electrodes spaced apart from each other; and a first piezoelectric material layer comprising a plurality of piezoelectric layer patterns spaced apart from each other, wherein the plurality of piezoelectric layer patterns correspond to the plurality of sub-electrodes in an one-to-one manner in order to form the plurality of the acoustic wave sensing units.

11. The method according to claim 10, wherein both an area of each of the piezoelectric layer patterns and an area of each of the sub-electrodes are less than or equal to 90 μm×90 μm.

12. The method according to claim 10, wherein the acoustic wave detection device further comprises:
a second electrode layer located at a side, away from the first electrode layer, of the first piezoelectric material layer.

13. The method according to claim 12, wherein both a material of the first electrode layer and a material of the second electrode layer comprise a transparent conductive material and a material of the first piezoelectric material layer is transparent.

14. The method according to claim 1, wherein the acoustic wave detection device comprises a plurality of acoustic wave detection units which comprise the plurality of the acoustic wave sensing units respectively, and each of the acoustic wave detection units comprises:
a piezoelectric element configured to generate an electrical signal in a case that an acoustic wave signal from the acoustic wave generation device passes through the piezoelectric element; and
a capacitor element arranged in parallel with the piezoelectric element and configured to store the electrical signal.

15. The method according to claim 14, wherein the acoustic wave detection device further comprises:
a plurality of transistors which are in electrical connection with the plurality of the acoustic wave detection units respectively, wherein each of the transistors comprises a gate electrode, a source electrode and a drain electrode, and the source electrode is connected to one of the acoustic wave detection units which is electrically connected with the transistor.

16. The method according to claim 1, wherein the acoustic wave generation device comprises a third electrode layer, a second piezoelectric material layer and a fourth electrode layer sequentially arranged on the first substrate, wherein the third electrode layer and the fourth electrode layer are configured to apply an electrical signal to the second piezoelectric material layer.

17. The method according to claim 1, further comprising determining a touch position according to the acoustic wave signal which is detected, in a case that the touch event occurs.

18. A pressure detection method for the detection assembly wherein the detection assembly comprises:
a first substrate; an acoustic wave generation device provided on the first substrate; an acoustic wave detection device provided on the first substrate and at a side, away from the first substrate, of the acoustic wave generation device, wherein the acoustic wave detection device comprises a plurality of acoustic wave sensing units spaced apart from each other; a contact layer covering the acoustic wave detection device; and a spacing layer located between the acoustic wave generation device and the acoustic wave detection device in a direction perpendicular to the first substrate;
wherein the detection method comprises:
transmitting an acoustic wave signal by the acoustic wave generation device in a direction from the first substrate to the contact layer, wherein the acoustic wave signal is transmitted at a first time;
detecting the acoustic wave signal by using the acoustic wave detection device, wherein the acoustic wave signal is detected at a second time; and
determining a value of a pressure applied to the contact layer according to a difference between the second time and the first time.

19. The pressure detection method according to claim 18, the detection assembly further comprising:
a second substrate located between the acoustic wave generation device and the acoustic wave detection device in the direction perpendicular to the first substrate; and
a support portion located between the second substrate and the acoustic wave generation device in the direction perpendicular to the first substrate so as to form the spacing layer.

20. The pressure detection method according to claim 19, wherein the support portion does not overlap the plurality of the acoustic wave sensing units in the direction perpendicular to the first substrate.

* * * * *

UNITED STATES PATENT AND TRADEMARK OFFICE
CERTIFICATE OF CORRECTION

| | |
|---|---|
| PATENT NO. | : 10,303,279 B2 |
| APPLICATION NO. | : 15/540440 |
| DATED | : May 28, 2019 |
| INVENTOR(S) | : Wang et al. |

Page 1 of 1

It is certified that error appears in the above-identified patent and that said Letters Patent is hereby corrected as shown below:

On the Title Page

Item (30) showing foreign application priority data needs to be added:
(30) Foreign Application Priority Data
Mar. 18, 2016 (CN) 201610159269.3

Signed and Sealed this
Twenty-third Day of February, 2021

Drew Hirshfeld
*Performing the Functions and Duties of the
Under Secretary of Commerce for Intellectual Property and
Director of the United States Patent and Trademark Office*